(12) United States Patent
Belot

(10) Patent No.: US 7,385,254 B2
(45) Date of Patent: Jun. 10, 2008

(54) STRUCTURE FOR PROTECTION AGAINST RADIO DISTURBANCES

(75) Inventor: Didier Belot, Rives (FR)

(73) Assignee: STMicroelectronics S.A., Montrouge (FR)

( * ) Notice: Subject to any disclaimer, the term of this patent is extended or adjusted under 35 U.S.C. 154(b) by 821 days.

(21) Appl. No.: 10/467,194

(22) PCT Filed: Feb. 4, 2002

(86) PCT No.: PCT/FR02/00423

§ 371 (c)(1),
(2), (4) Date: Aug. 5, 2003

(87) PCT Pub. No.: WO02/063692

PCT Pub. Date: Aug. 15, 2002

(65) Prior Publication Data
US 2004/0051115 A1    Mar. 18, 2004

(30) Foreign Application Priority Data
Feb. 5, 2001    (FR) .................................. 01 01524

(51) Int. Cl.
*H01L 23/62* (2006.01)
*H01L 27/082* (2006.01)
*H01L 27/102* (2006.01)
*H01L 29/70* (2006.01)
*H01L 31/11* (2006.01)

(52) U.S. Cl. ............... 257/361; 257/575; 257/E29.026; 257/E29.037; 257/E23.62

(58) Field of Classification Search ................ 438/309, 438/342, 350, 314; 257/361, 360, 362, 691, 257/575, 197, E29.026, E29.037
See application file for complete search history.

(56) References Cited

U.S. PATENT DOCUMENTS

| 4,611,388 | A | * | 9/1986 | Pande ....................... 438/317 |
| 5,821,148 | A |   | 10/1998 | Leighton et al. ............ 438/309 |
| 5,895,249 | A | * | 4/1999 | Zambrano et al. .......... 438/356 |
| 6,204,717 | B1 | * | 3/2001 | Nagasu et al. .............. 327/318 |
| 6,414,370 | B1 | * | 7/2002 | Nagasu et al. .............. 257/575 |
| 6,762,462 | B2 | * | 7/2004 | Belot ......................... 257/361 |
| 7,129,144 | B2 | * | 10/2006 | Tseng ........................ 438/309 |
| 2002/0024060 | A1 | * | 2/2002 | Shougomori et al. ....... 257/197 |
| 2002/0158308 | A1 | * | 10/2002 | Huber et al. ................ 257/552 |
| 2004/0119091 | A1 | * | 6/2004 | Suzuki et al. ............... 257/197 |
| 2005/0110095 | A1 | * | 5/2005 | Shih et al. .................. 257/361 |
| 2005/0269596 | A1 | * | 12/2005 | Ota et al. .................... 257/197 |
| 2006/0030114 | A1 | * | 2/2006 | Yeh et al. .................... 438/379 |
| 2007/0018307 | A1 | * | 1/2007 | Shinomiya .................. 257/691 |

FOREIGN PATENT DOCUMENTS

EP    0 081 396 A2    6/1983
FR    2 787 636    6/2000

* cited by examiner

*Primary Examiner*—Walter L Lindsay, Jr.
(74) *Attorney, Agent, or Firm*—Lisa K. Jorgenson; Harold H. Bennett, II; Seed IP Law Group, PLLC

(57) ABSTRACT

A structure of protection of a first area of a semiconductor wafer including a substrate of a first conductivity type against high-frequency noise likely to be injected from components formed in the upper portion of a second area of the wafer, includes a very heavily-doped wall of the first conductivity type having substantially the depth of the upper portion. The wall is divided into three heavily-doped strips of the first conductivity type separated and surrounded by medium-doped intermediary strips of the first conductivity type. The distance between the heavily-doped strips being of the order of magnitude of the substrate thickness.

15 Claims, 3 Drawing Sheets

STRUCTURE FOR PROTECTION AGAINST RADIO DISTURBANCES

BACKGROUND

1. Technical Field

The present invention relates to integrated circuits intended for operating at very high frequency and more specifically to such circuits, some portions of which are sensitive to noise signals.

2. Description of the Related Art

For example, in the field of telecommunications and of portable phones, it is desired to integrate on a same chip logic signal processing circuits and analog amplifying circuits, intended for operating at very high frequencies, greater than 1 GHz, ranging for example from 2 to 10 GHz. In particular, a low-noise analog amplifier directly connected to the antenna output is generally provided. It is important to avoid that the noise resulting from the switchings of the digital signals affects the amplifier inputs since this noise would then be injected back into the circuit with a very high gain.

To test the sensitivity to noise of an integrated circuit and of various protection circuits, a test structure such as that shown in FIG. 1 may be used. In this test structure, the chip is divided into squares. For example, a chip portion having a 5-millimeter side is divided into 15×15 squares. A circuit likely to transmit square signals is formed in the first square (square C1-1 of the first column and of the first row) and the high-frequency signal collected in the other squares is studied. A portion of the component including the squares most diagonally distant from square C1-1 is surrounded with a protection structure 10. The quality of this protective structure is tested by comparing the noise collected in square C14-14 (fourteenth column, fourteenth row) arranged inside of the protective structure and the noise collected for example in square C1-15 (first column, fifteenth row) located substantially at the same distance from square C1-1 as the squares located inside of protective structure 10.

As illustrated by the partial cross-section view of FIG. 2, the case where the structure is formed on a lightly-doped P-type solid single-crystal silicon substrate 11 (P⁻) will more specifically be considered. The various components of the integrated circuit are assumed to be formed in an upper portion of this substrate, for example, in a lightly-doped N-type epitaxial layer, a portion 12 of which is shown at the limit of protective structure 10. The various components are for example directly formed in this epitaxial layer (case of the some bipolar transistors) or in more heavily-doped P-type wells (13) or N-type wells (14) in which N-channel and P-channel MOS transistors will in particular be found. The protective structure is formed of a heavily-doped P-type wall 15 connected to ground.

Such a protective structure is efficient at frequencies smaller than 1 GHz. However, as illustrated in FIG. 3, the protection is no longer efficient when the frequencies increase. This is in particular due to the fact that the connection between heavily-doped wall 15 and the ground inevitably includes an inductance 1 having an impedance which increases along with frequency.

FIG. 3 shows the attenuation in dB at the level of square C1-15 and at the level of square C14-14 of a signal transmitted by square C1-1, according to frequency (in logarithmic scale), between 100 MHz and 10 GHz. In square C1-15, it can be seen that this attenuation decreases as the frequency increases. In square C14-14 (or in any other square located inside of protective structure 10), it can be seen that, until a frequency on the order of one gigahertz is reached, the attenuation is much greater than for square C1-15. However, for frequencies on the order of from 1 to 2 GHz, the slope of curve C14-14 changes and the attenuation caused by isolating wall 15 becomes negligible. It can even be acknowledged that, for frequencies greater than 2 GHz, the isolating wall has a negative effect, that is, the attenuation of the signal from square C1-1 is smaller in square C14-14, which is "protected" by isolating structure 10 than in square C1-15, which is not protected.

Various theoretical explanations could be found for this phenomenon, which in any case is certainly due to the fact that the impedance of the connection of isolating wall 15 to ground becomes high. Thus, in prior art, various means for reducing the value of this impedance have been tried. One of these means is to use a so-called "flip-chip" semiconductor chip assembly mode in which the connection points on the chip are metallized and coated with conductive balls. Each conductive ball is then directly put in contact with a metallized region of a printed circuit board to which this chip is to be connected. Connections with a much smaller impedance than in the case where the chips are assembled in a package and connected to the package tabs by wires are thus obtained. However, this has not enabled completely solving the problem posed and has only partially improved the features of known protection structures.

BRIEF SUMMARY

Thus, an object of the present invention is to provide a novel structure of protection against noise of an area of an integrated circuit formed on a massive substrate.

To achieve this object, the present invention provides a structure of protection of a first area of a semiconductor wafer including a substrate of a first conductivity type against high-frequency noise likely to be injected from components formed in the upper portion of a second area of the wafer, including a very heavily-doped wall of the first conductivity type having substantially the depth of said upper portion. The wall is divided into three heavily-doped strips of the first conductivity type separated and surrounded by medium-doped intermediary strips of the first conductivity type, the distance between the end heavily-doped strips being of the order of magnitude of the substrate thickness.

According to an embodiment of the present invention, the first conductivity type is type P.

According to an embodiment of the present invention, each of the three heavily-doped P-type strips is divided into successive segments.

According to an embodiment of the present invention, each segment is connected to a ground plane via a flip-chip assembly.

BRIEF DESCRIPTION OF THE SEVERAL VIEWS OF THE DRAWING(S)

The foregoing objects, features and advantages of the present invention will be discussed in detail in the following non-limiting description of specific embodiments in connection with the accompanying drawings, in which.

DETAILED DESCRIPTION

As usual in the representation of semiconductor components, the various cross-section views and top views of components are not drawn to scale in the various drawings. In these drawings, same references designate identical or similar elements.

Figure 4:
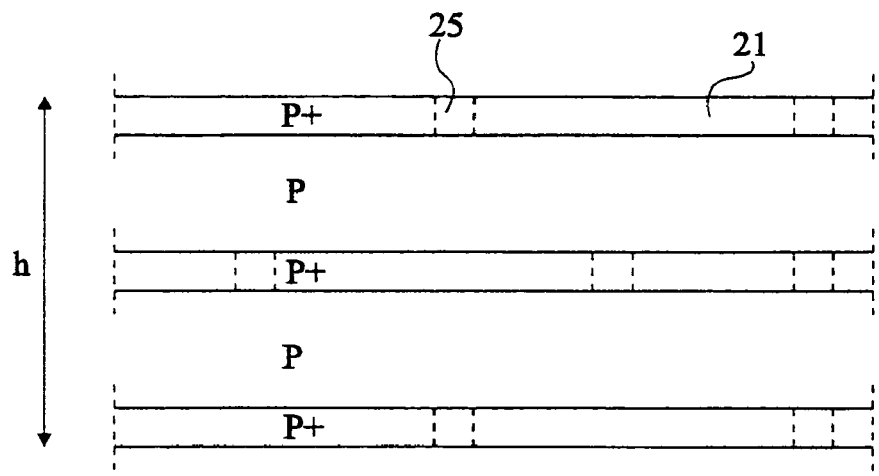
FIG. 4 shows a partial top view of an isolating wall according to the present invention.
Figure 5:
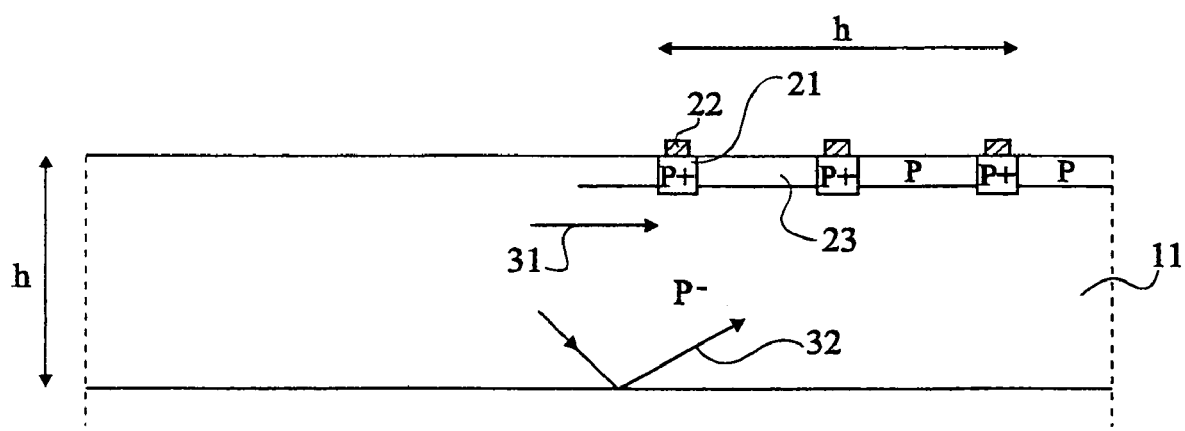
FIG. 5 shows a partial cross-section view of an isolating wall according to the present invention.

As shown in FIGS. 4 and 5, the present invention provides an isolating wall formed of three heavily-doped $P^+$-type parallel strips 21 covered with metallizations 22. Metallizations 22 are preferably independently connected to a ground plane, for example by a flip-chip type assembly. $P^+$ strips 21 are separated by P-type regions 23 of a doping level which is intermediary between the doping level of the substrate and the doping level of the $P^+$ regions. Regions 23 of intermediary doping level are preferably also provided outside of the end strips 21. The lateral distance between the end strips 21 has a value h of the same order of magnitude as thickness h of the substrate.

Assuming in FIG. 5 that the portion to be protected is to the right of the drawing and that the high-frequency noise wave source is to the left of the drawing, the first $P^+$ strip 21 will tap the carriers moving close to the substrate surface and designated by reference 31. If the rear substrate surface is isolated, the substrate will generally behave as a wave guide for high frequencies and the carriers will move as high-frequency waves reflecting on the rear surface. The carriers 32 reflected on the rear surface in the vicinity of the left-hand portion of the isolating structure according to the present invention directly hit a strip 21 or a region 23 of intermediary doping level and will move resistively towards $P^+$ strips 21.

Figure 1:
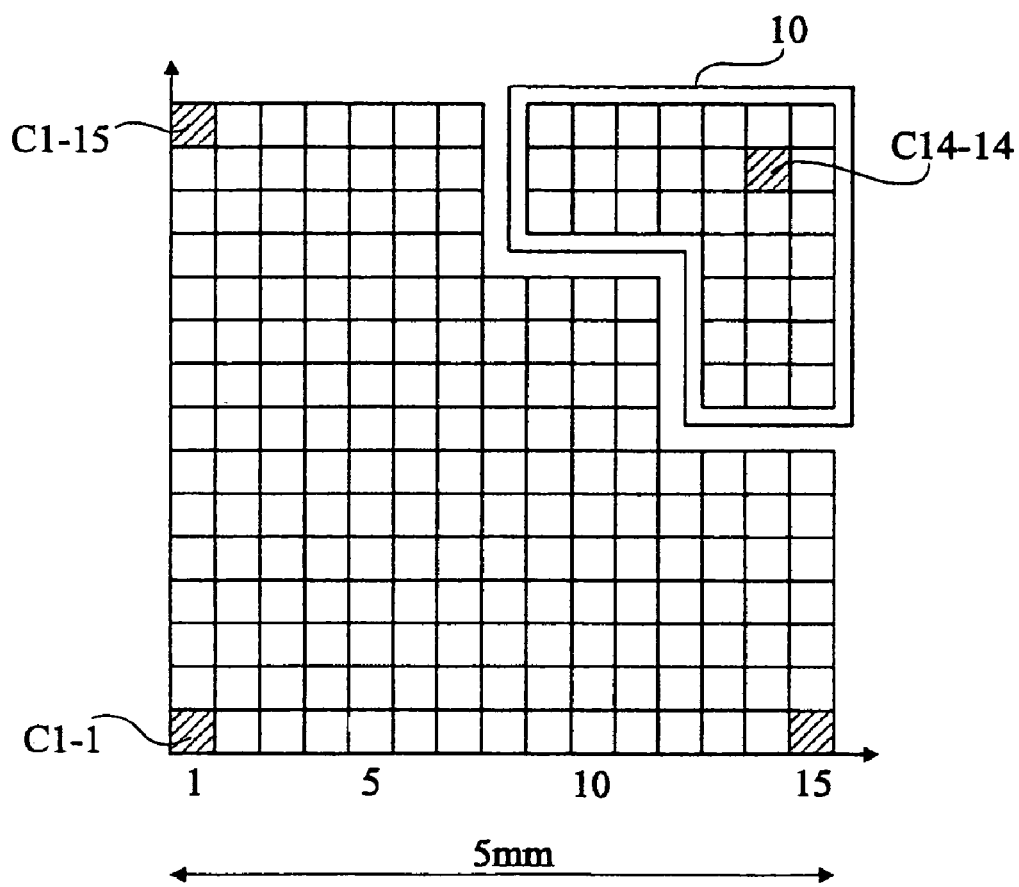
FIG. 1 shows an integrated circuit test structure.
Figure 2:
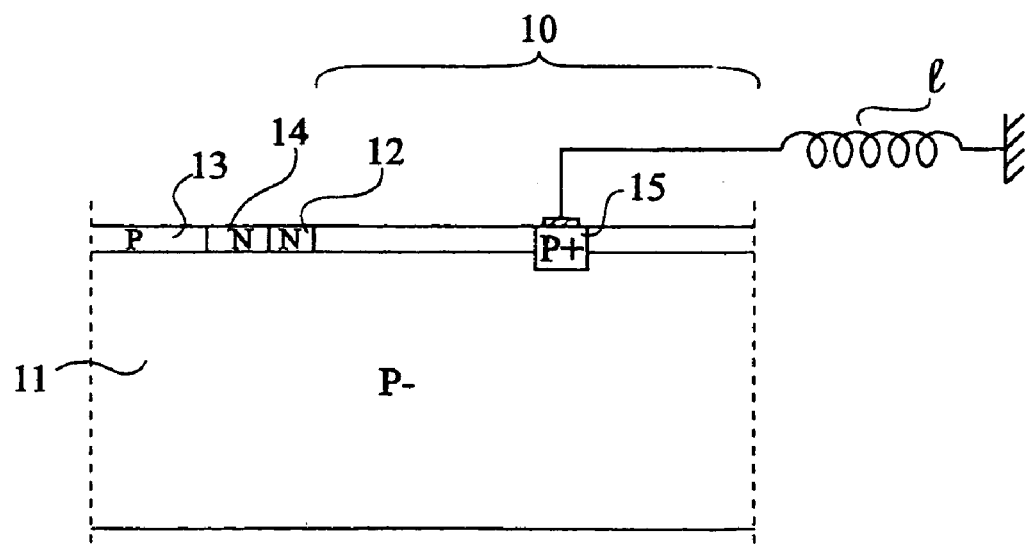
FIG. 2 shows a simplified cross-section view of a portion of an integrated circuit in the vicinity of an isolating wall.
Figure 3:
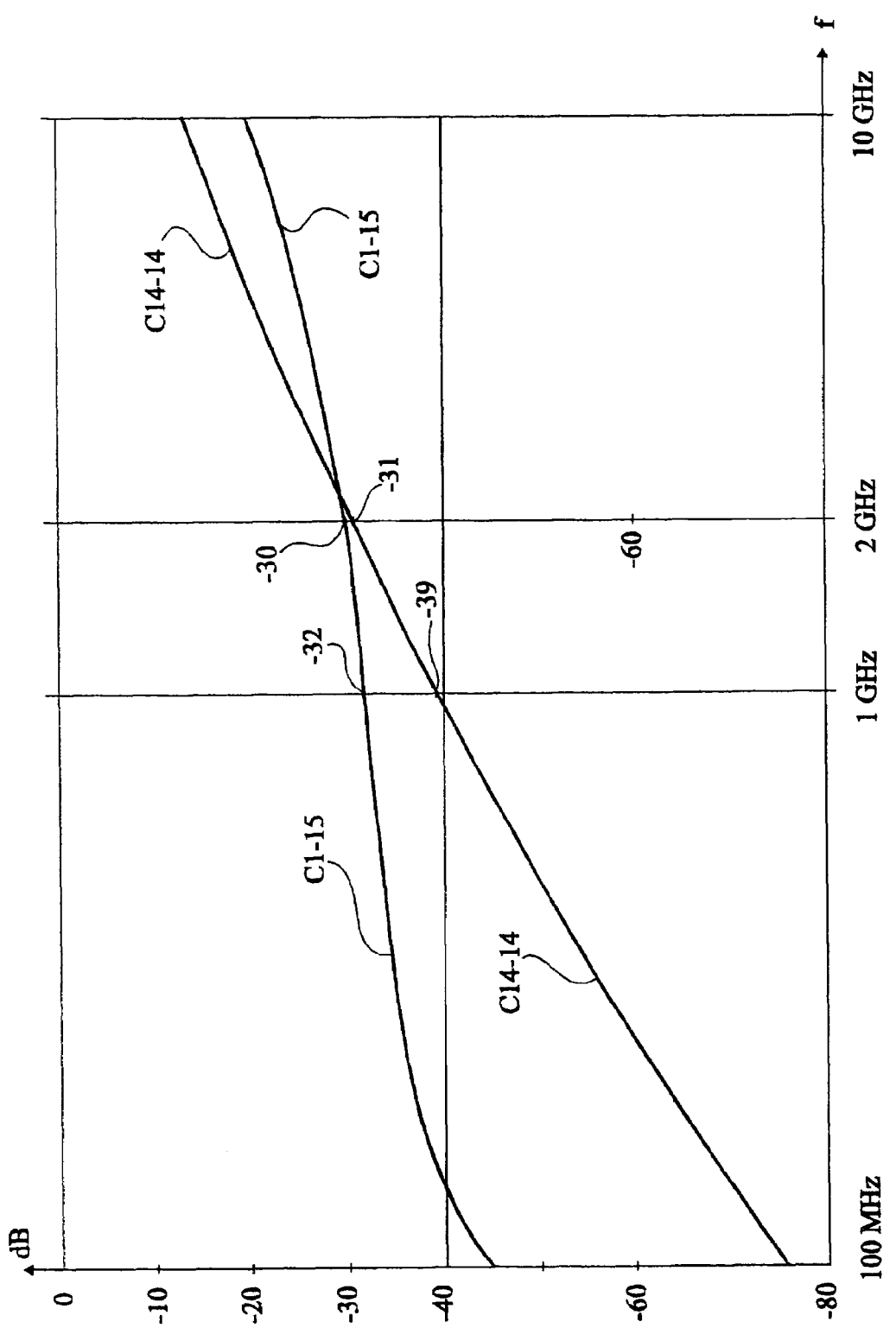
FIG. 3 shows the attenuation according to frequency at various points of an integrated circuit chip.

With a triple wall according to the present invention, all other things being equal, a −54-dB damping is obtained between squares C1-1 and C14-14 for a 2-GHz frequency, while, as shown in FIG. 3, this damping is only −31 dB at C14-14 with a continuous wall and the "natural" damping appearing on curve C1-15 is on the order of −30 dB. Experience shows that this result is not obtained with a single wide $P^+$ strip.

To further improve the operation of the system according to the present invention, instead of using continuous strips 21, these strips may be divided into successive segments, each segment being coated with a metallization independently connected to a ground plane. Preferably, the segments will be arranged in quincunx, that is, the intervals between two segments of the median strips will be placed substantially in front of the middle of segments of the end strips. This segmentation is illustrated as an example by areas 25 shown between two dotted lines in FIG. 4. All other things being equal, a −60-dB damping is then obtained for a 2-GHz frequency between squares C1-1 and C14-14.

As an example, for a P substrate having a 350-μm thickness, three $P^+$ strips having a 10-μm width spaced apart by 175 μm may be used, these strips being segmented into segments having a length on the order of 175 μm, each segment being provided with a contact pad, the distance between pads being on the order of 200 μm.

The invention claimed is:

1. A structure of protection of a first area of a semiconductor wafer including a substrate of a first conductivity type against high-frequency noise likely to be injected from components formed in the upper portion of a second area of the wafer, comprising:
   a heavily-doped wall of the first conductivity type having substantially the depth of said upper portion, wherein said wall is divided into three heavily-doped strips of the first conductivity type separated and surrounded by medium-doped intermediary strips of the first conductivity type, the distance between the end heavily-doped strips being of the order of magnitude of the substrate thickness.

2. The structure of claim 1 wherein the first conductivity type is type P.

3. The structure of claim 1 wherein each of the three heavily-doped P-type strips is divided into successive segments.

4. The structure of claim 3 wherein each segment is connected to a ground plane via a flip-chip assembly.

5. A device comprising:
   a semiconductor substrate; and
   a barrier formed in the semiconductor substrate and configured to separate a first region of the semiconductor substrate from a second region of the semiconductor substrate, the barrier having three heavily doped strips of a first type of conductivity, the three strips being separated by two medium-doped strips of the first type of conductivity, each of the three strips being connected to a circuit ground.

6. The device of claim 5 wherein the barrier further includes a medium doped strip of the first type of conductivity on either side of the barrier, in the same plane as the three strips.

7. The device of claim 5 wherein each of the three heavily doped strips is divided into a plurality of segments and wherein each of the plurality of segments is individually connected to the circuit ground.

8. The device of claim 7 wherein the segments are configured such that a gap between segments of one of the three strips is not directly aligned with a gap between segments of an adjoining one of the three strips.

9. The device of claim 5 wherein the width of the barrier is in the same order of magnitude as the thickness of the semiconductor substrate.

10. The device of claim 5, further comprising a circuit formed in the first region of the semiconductor substrate.

11. The device of claim 10 wherein the barrier surrounds the circuit.

12. A method, comprising:
   generating a high frequency noise signal in a first integrated circuit formed in a semiconductor substrate; and
   blocking the high frequency noise signal from interfering with a second integrated circuit formed in the substrate through the use of a protective structure formed in the substrate, the structure having three heavily doped strips of a first type of conductivity, the three strips being separated by two medium-doped strips of the first type of conductivity, the structure being configured to separate the second integrated circuit from the first integrated circuit, each of the three strips being connected to a circuit ground.

13. The method of claim 12 wherein the structure surrounds the second integrated circuit.

14. The method of claim 12 wherein the structure further includes a medium doped strip of the first type of conductivity on either side of the barrier, in the same plane as the three strips.

15. The method of claim 12 wherein each of the three heavily doped strips are divided into a plurality of segments and wherein each of the plurality of segments is individually connected to the circuit ground.

* * * * *